(12) United States Patent
Mallinson

(10) Patent No.: US 6,844,838 B2
(45) Date of Patent: Jan. 18, 2005

(54) DIGITAL TO ANALOG CONVERTER HAVING A LOW POWER SEMI-ANALOG FINITE IMPULSE RESPONSE CIRCUIT

(75) Inventor: Andrew Martin Mallinson, Fremont (CA)

(73) Assignee: ESS Technology, Inc., Fremont, CA (US)

( * ) Notice: Subject to any disclaimer, the term of this patent is extended or adjusted under 35 U.S.C. 154(b) by 0 days.

(21) Appl. No.: 10/444,813

(22) Filed: May 22, 2003

(65) Prior Publication Data

US 2004/0233088 A1 Nov. 25, 2004

(51) Int. Cl.[7] .............................................. H03M 1/66
(52) U.S. Cl. ...................................... 341/144; 341/143
(58) Field of Search ................................ 341/154, 143, 341/144

(56) References Cited

U.S. PATENT DOCUMENTS

| | | | | |
|---|---|---|---|---|
| 3,500,215 A | * | 3/1970 | Leuthold et al. ............ 327/552 |
| 3,521,170 A | * | 7/1970 | Leuthold et al. ................ 708/3 |
| 5,544,081 A | | 8/1996 | Yukawa .......................... 208/3 |
| 5,590,155 A | | 12/1996 | Yasuda ........................ 375/261 |
| 5,625,357 A | | 4/1997 | Calber ......................... 341/143 |
| 6,072,416 A | * | 6/2000 | Shima ......................... 341/159 |
| 6,181,265 B1 | * | 1/2001 | Lee ............................. 341/145 |
| 6,433,717 B1 | * | 8/2002 | Leung ......................... 341/144 |
| 6,448,917 B1 | * | 9/2002 | Leung et al. ................ 341/144 |
| 6,486,926 B1 | | 11/2002 | Heizmann .................... 348/746 |

* cited by examiner

Primary Examiner—Peguy JeanPierre
(74) Attorney, Agent, or Firm—Stevens Law Group, P.C.

(57) ABSTRACT

A circuit is provided having a secondary semi-analog FIR filter connected to a primary filter via a coefficient to reduce the size of the sizes of the resistors used in the primary filter. The coefficient may be one or more intermediate resistors connected between separate resistor/voltage driver banks that make up the FIR filter. The result is a circuit that takes up less chip space required to accommodate the required resistance for a digital to analog converter (DAC). The invention configures the resistor structure to produce the same output result as a conventional circuit, but with smaller resistor values that take up less surface area on the chip.

12 Claims, 6 Drawing Sheets

US 6,844,838 B2

DIGITAL TO ANALOG CONVERTER HAVING A LOW POWER SEMI-ANALOG FINITE IMPULSE RESPONSE CIRCUIT

BACKGROUND

The invention generally relates to components and circuits that make up digital to analog (d/a) converters (DACs), and, more particularly, to an d/a converter having a low power semi-analog finite impulse response circuit to reduce the size of the required resistor values, reducing the occupied chip.

One conventional configuration of d/a converters has a series of resistors in a resistor bank, powered by individual voltage drivers. The series of resistors has increasing resistor values, with larger resistor values on the opposite ends. These resistor components take up the most chip space in a d/a converter circuit. In operation, digital signal values are received at the resistor banks and, according to the values, drive the voltage switches that draw current across the resistors to generate an analog waveform. This is how the digital signal is converted to an analog signal.

One motivation of circuit designers is to reduce the size of the chip space required for circuit components. In conventional DACs, the resistor values used in the DACs are large and account for the majority of the space on the chip.

If it were possible to achieve the same conversion result of a d/a converter with smaller resistor values, then chip space could be reduced. As will be seen below, the invention accomplishes this in an elegant manner.

SUMMARY OF INVENTION

The invention provides a digital to analog conversion circuit configuration having a secondary semi-analog FIR filter connected to a primary filter via a coefficient, such as a resistor of a predetermined value, which may be a division coefficient, multiplication coefficient or other coefficient, to reduce the size of the sizes of the resistors used in the primary filter. The coefficient may be one or more intermediate resistors connected between separate resistor/voltage driver banks that make up the FIR filter. The result is a circuit that takes up less chip space required to accommodate the required resistance for a digital to analog converter (DAC). A circuit configured according to the invention achieves the same conversion result as a conventional aid converter with smaller resistor values, saving chip space. The invention configures the resistor structure to produce the same output result as a conventional circuit, but with smaller resistor values. The smaller values equate to smaller surface area required on the chip for the circuit that take up less space. The result is a smaller circuit that produces the same output result as a conventional circuit.

DETAILED DESCRIPTION

Figure 1:
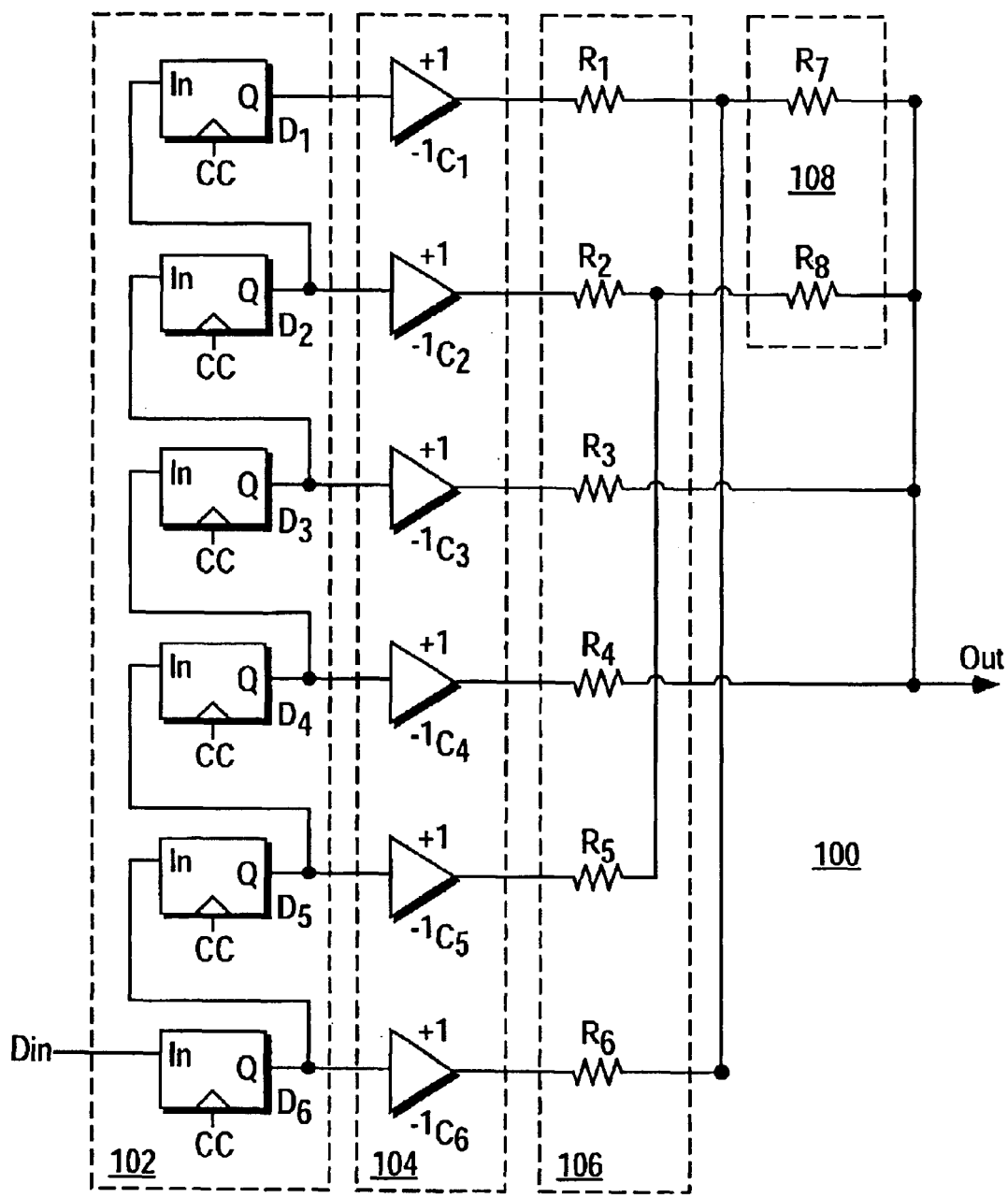
FIG. 1 is a diagrammatic view of a semi-analog FIR DAC according to the invention.

The invention is described below in one embodiment in the context of a DAC implementing a semi-analog FIR filter with reduced resistor values. It will be appreciated by those skilled in the art, however, that other useful applications of the invention may be implemented in applications where FIR circuits are useful, without departing from the spirit and scope of the invention, where the scope is defined in the appended claims and their equivalents.

In one embodiment, a DAC is configured with a semi-analog FIR circuit. The FIR circuit is configured in a series of separate banks of resistors and corresponding current drivers. Each separate bank is connected to another bank via one or more intermediate coefficients, such as a resistor value that serves to reduce the size of the resistors in the FIR circuits. Other coefficients including multiplication, division or other coefficients that are known to those in the art may be used as well. The embodiments below are described in the context of an intermediate resistor value that serves to reduce the size of the resistor values in a FIR DAC circuit, and in one embodiment using a Thevenin equivalent circuit. Other configurations am possible within the scope of the invention. The result is a DAC having relatively smaller resistor values than conventional circuits, and that consequently takes up less chip space.

In a FIR DAC, the coefficients are summed at the output, and those coefficients are the impulse response of the FIR DAC. The operation of the FIR DAC depends critically on the time of operation, where each weighted combination of a voltage source and a resistor, or current source, known in the art at a "tap", is representative of the signal at a DIFFERENT time. This contrasts with a conventional DAC, where the set of weighted taps are driven from components of the sample at the SAME time. Thus, the conventional DAC operates on a sample of an incoming signal at one specific time, where the FIR DAC, operates on samples of an incoming signal taken at different times. The result is that any resistor scheme in a FIR DAC is a complex one. In contrast, the resistor value of each tap of a conventional DAC can be determined by a recursive formula, where each resistor value is a fixed proportion of its neighbouring tap's resistor value.

The invention includes a method of designing a circuit having intermediate resistor values that are determined by a non-recursive formula. A FIR DAC requires a non-recursive formula because there is no simple relation of the tap value to that of the neighbouring tap, whereas the non-FIR DAC is a recursive formula. In the case of the regular DAC the relation between adjacent taps is or can be made to be trivial—namely that the tap is always half the weight of its neighbour. This is known as the R-2R ladder circuit design. The relation from one tap to the next is fixed, thus a technique developed for the mathematics of infinite series can be used. Namely, if an operation can be defined that transforms a tap to its neighbouring tap then that operation applied to all elements of the series generates the same series again. Thus, the operation over the infinite number of taps need only consider the "end cases" and can be solved in a closed form:

$$Y = a_0 + a_1 + a_2 + \ldots + a_n$$

It is known that $O(a_n) = a_{n+1}$. O therefore represents the fixed operation that can take one tap to its neighboring tap. Therefore:

$$O(Y) = O(a_0) + O(a_1) + O(a_2) + \ldots + O(a_n)$$

$$O(Y) = a_1 + a_2 + a_3 + \ldots + a_{0\setminus n+1}$$

$$Y - O(Y) = a_0 - a_{0n+1}$$

A variant of this technique can be used to derive a circuit that simply repeats from tap to tap to make the summation in the case where the relationship between adjacent taps is fixed. This is the mathematic basis of the R-2R ladder and this why an R-2R (or any other fixed and repetitive circuit) for each tap can work.

In the case of the FIR DAC, to which the invention is directed, the relation of one tap to its neighbor is not fixed, so, in practice, the simple recursively applied similar solution per tap as described does work. The solution is complex by the nature of the circuit. The distinction is the different data that is sent into the resistor networks in the different circuits. In a non-FIR DAC, the data is simply a multi-bit representation of one sample in time. In a FIR DAC, the data is representing a succession of samples of the signal at different times. Therefore, the FIR DAC cannot use the simple ladder, because the weights are the impulse response of the semi analog filter, and thus are always varying. Any given solution is fixed, where it does not vary with time, but it does not have a fixed relation from tap to tap. As a result, the circuit is typically not the identical circuit between each tap.

Referring to FIG. 1, a semi-analog FIR DAC circuit having one bank of a FIR filter that embodies the invention is illustrated. The filter 100 includes a bank of D-type flip flops 102 that is made up of individual daisy-chained flip flops $D_1$ through $D_6$. The flip flops communicate with a common clock, cc, not shown, that clocks the flip flops in synchronicity. The circuit has an input $D_{in}$ configured to receive a digital signal input. In operation, flip flop $D_6$ receives the individual pulses of the digital input signal at its input, In, according to the common clock, and outputs a signal at its Q output. In operation, as the signal comes in, each of the daisy chained flip flops, $D_1$ through $D_5$, receives an input from the output of its predecessor flip flop. In response to an input signal to any given flip flop, a corresponding voltage source, such as one from bank 104— $C_1$ through $C_6$, is asserted between its range of outputs, such as +1 volt to −1 volt as shown, to drive a corresponding resistor, such as from bank 106— $R_1$ through $R_6$, to produce an output. According to the invention, one or more pairs of voltage drivers, such as $C_1$ and $C_6$ or $C_2$ and $C_5$, are joined to drive an intermediate resistor, such as from bank 108— $R_7$ through $R_8$ respectively. As discussed below, this circuit, and the methods used to design this circuit allow a circuit designer to design a circuit having a lower dynamic range of element values, using smaller resistor values for the circuit. This reduces the size of the circuit.

Figure 2A:
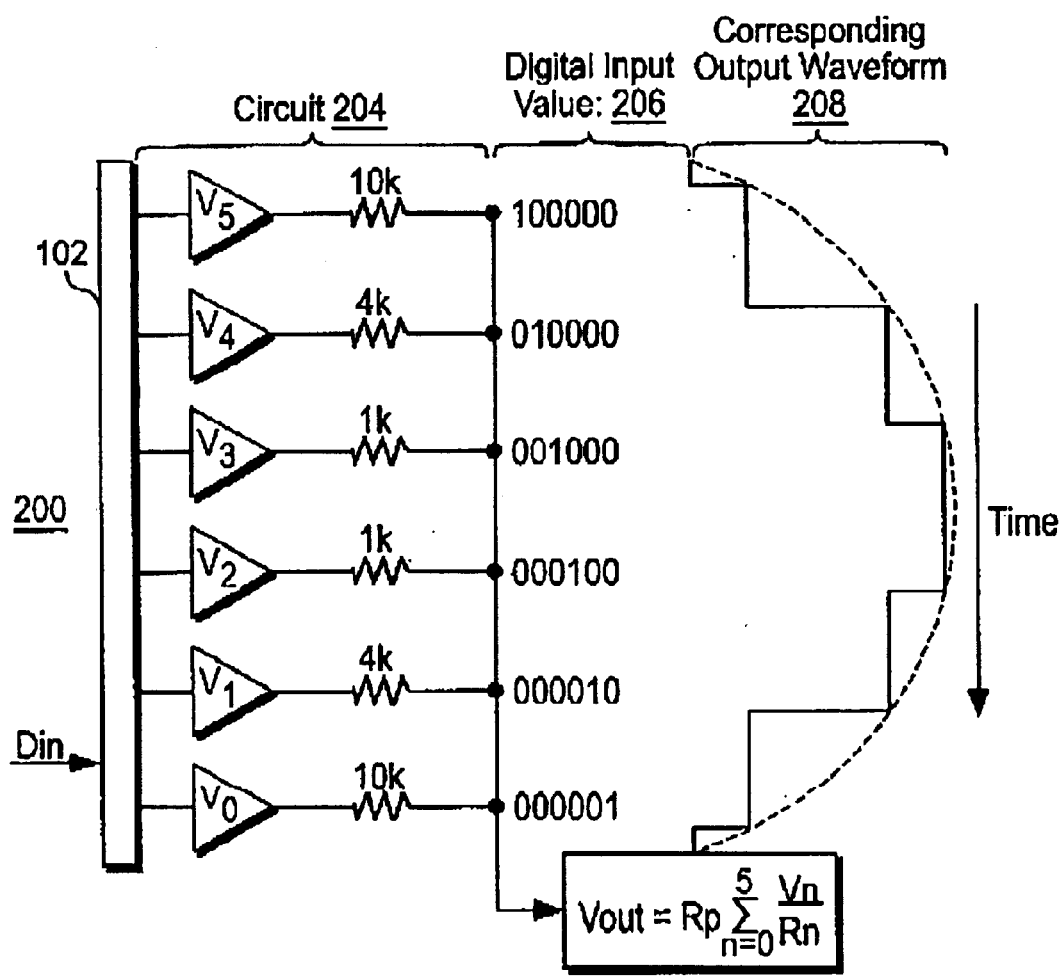
FIG. 2 is a diagrammatic view of a prior art DAC.

Referring to FIG. 2A, a conventional circuit 200 is illustrated having an input bank configured to receive an input signal, and a circuit 204 having a bank of voltage sources or drivers, $V_5$ through $V_0$, and connected at one end to corresponding resistor values kilo-ohms ("k"), 4 k, 1 k, 1 k, 4 k, and 10 k respectively. The voltage sources are equal in specification, and work in conjunction with the resistors act as the drivers for the output signal. These sources may be voltage sources that drive the resistors, such as in a FIR DAC. The invention is directed to the resistor configuration for use in conjunction with voltage sources.

Figure 2B:
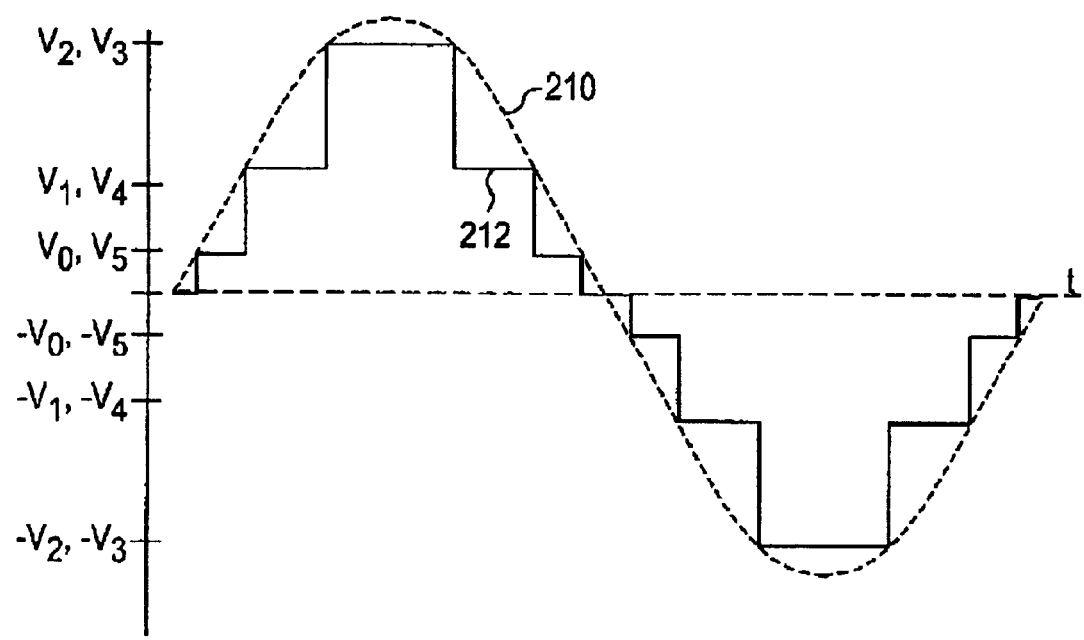

These resistors are connected together at another end to produce an output in response to the input signal that activates the respective voltage sources. The input is in the form of a digital input value, such as that of the sample digital input value list 206, which activates at least one of the voltage sources to drive a resistor, outputting a portion of an analog wave signal. The output is a composite of the individual output values delivered in a serial manner to give an output in the form of an analog waveform 208, which corresponds with the signal generated between the voltage sources and the resistors in a sequence over time. The output is defined by the formula $V_{out}=R_p \Sigma(V_n/R_n)$ $\{0 \leq n \leq 5\}$. Where $R_n$ represents each resistor and $R_p$ is the equivalent resistance of all the Rn connected in parallel. In FIG. 2B, a resultant waveform is illustrated. The cumulative resultant output is in the form of a sine wave, shown in the ideal form 210, and the composite form 212. The abscissa indicates the voltage values generated at the respective sources over time.

Figure 3A:
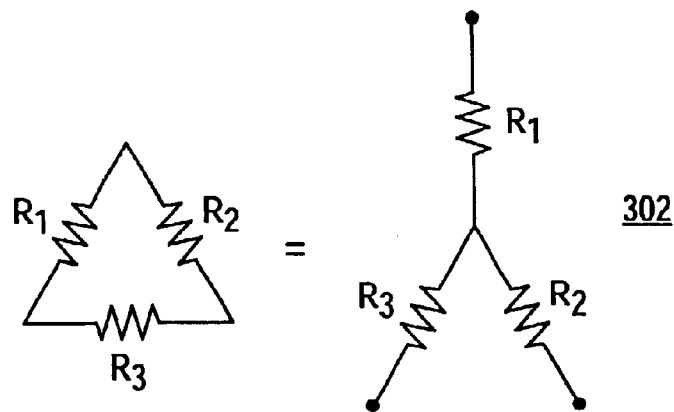
FIGS. 3A, 3B and 3C are diagrammatic views of a DAC according to the invention.
Figure 3B:
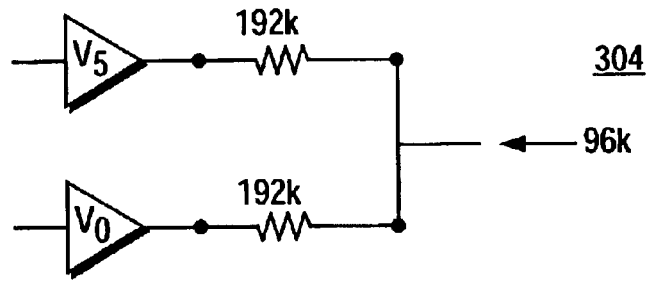
Figure 3C:
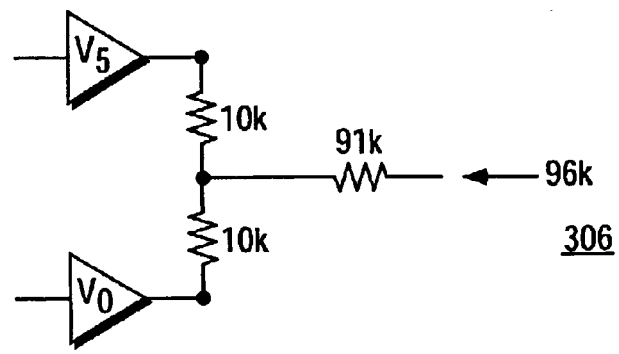

In practical applications of a FIR DAC, the resistor values on the end rails, $V_0$ and $V_5$ for example, reach large values, such as 192 k. According to the invention, these resistor values may be reduced by reconfiguring the resistor circuits. Referring to FIGS. 3A–3C, one method of reconfiguring the resistor values is illustrated. FIG. 3A illustrates the Thevenin equivalent theory, where the circuit configurations 302 are equivalent. FIG. 3B illustrates a pair of drivers, $V_0$ and $V_5$, connected together in a pair, just as they are connected in the circuit 200 (FIG. 2). It is well known by those in the art that, for linear networks, the open circuit output voltage and the output circuit output impedance characterise any two port network. Thus, the two resistors taken together are indistinguishable from any other network that has the same output impedance and the same open circuit voltage. Consequently, a set of three resistors may be substituted for the pair of resistors provided that the open circuit voltage and output impedance are the same. Looking into the two resistors connected at their common node, the equivalent resistance is 96 kilo ohms. Using the conversion discussed above in connection with FIG. 3A, the equivalent circuit 306, shown in FIG. 3C, shows the equivalent output resistance, 96 k, but with resistor values of 91 k and 10 k respectively.

Figure 4:
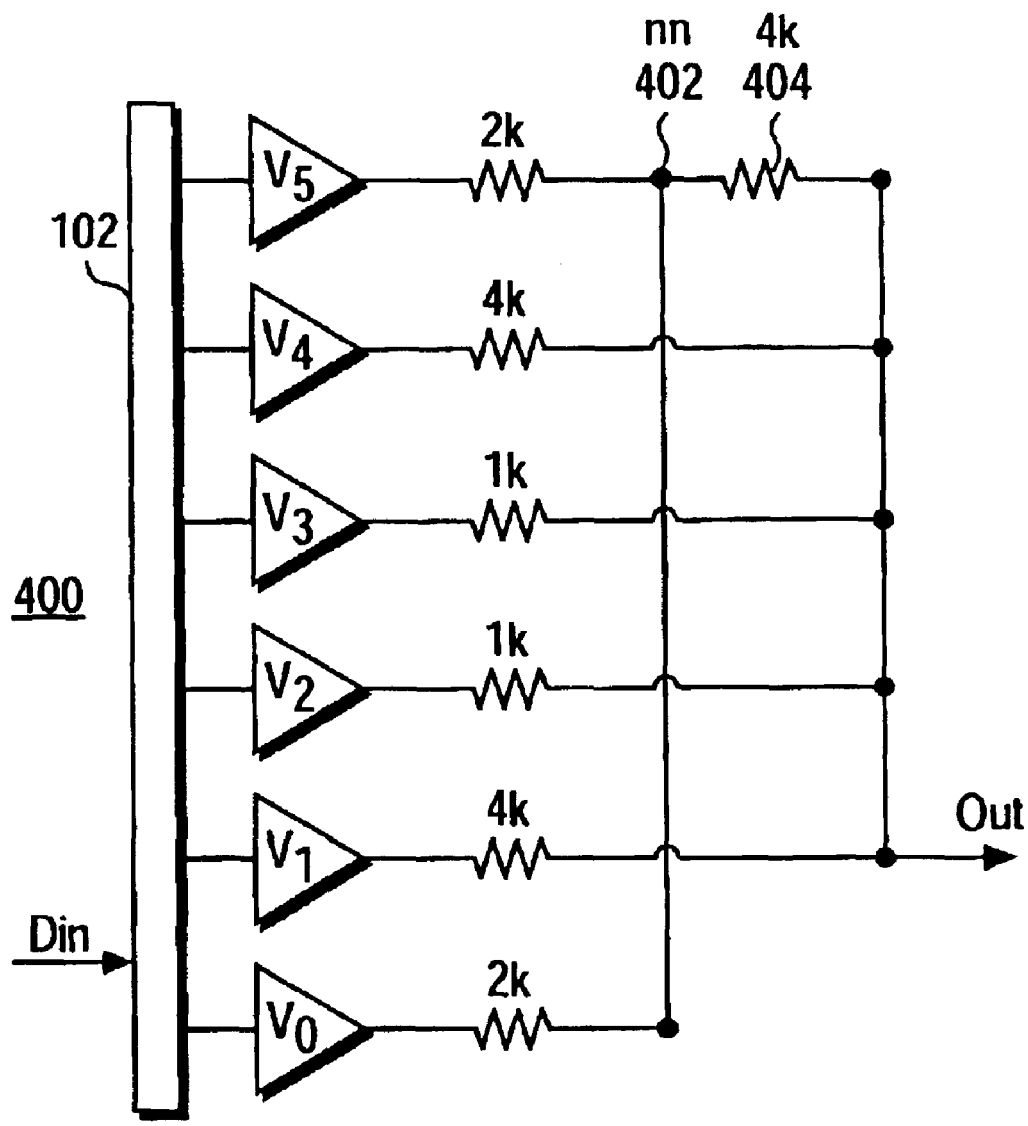
FIG. 4 is a diagrammatic view of a DAC according to the invention.

Applying this theory to the circuit 200 of FIG. 2, FIG. 4 shows a circuit 400 having a common node, or new node nn 402, that connects the outputs of the formerly 10 k resistors, and connects them to an intermediate resistor 404, having a value of 4 k, which is connected at another end to the output. As can be seen, the dynamic range, the range of resistor values, is reduced from 1 k–10 k to 1 k–4 k. And, the output resistance is the same as it was before the reconfiguration. This results in a reduced sized circuit that takes up less chip space. As discussed earlier, the resistor values take up the majority of area on a chip. By reducing the resistor values, the space taken up by the circuit on a circuit chip is reduced accordingly.

Figure 5:
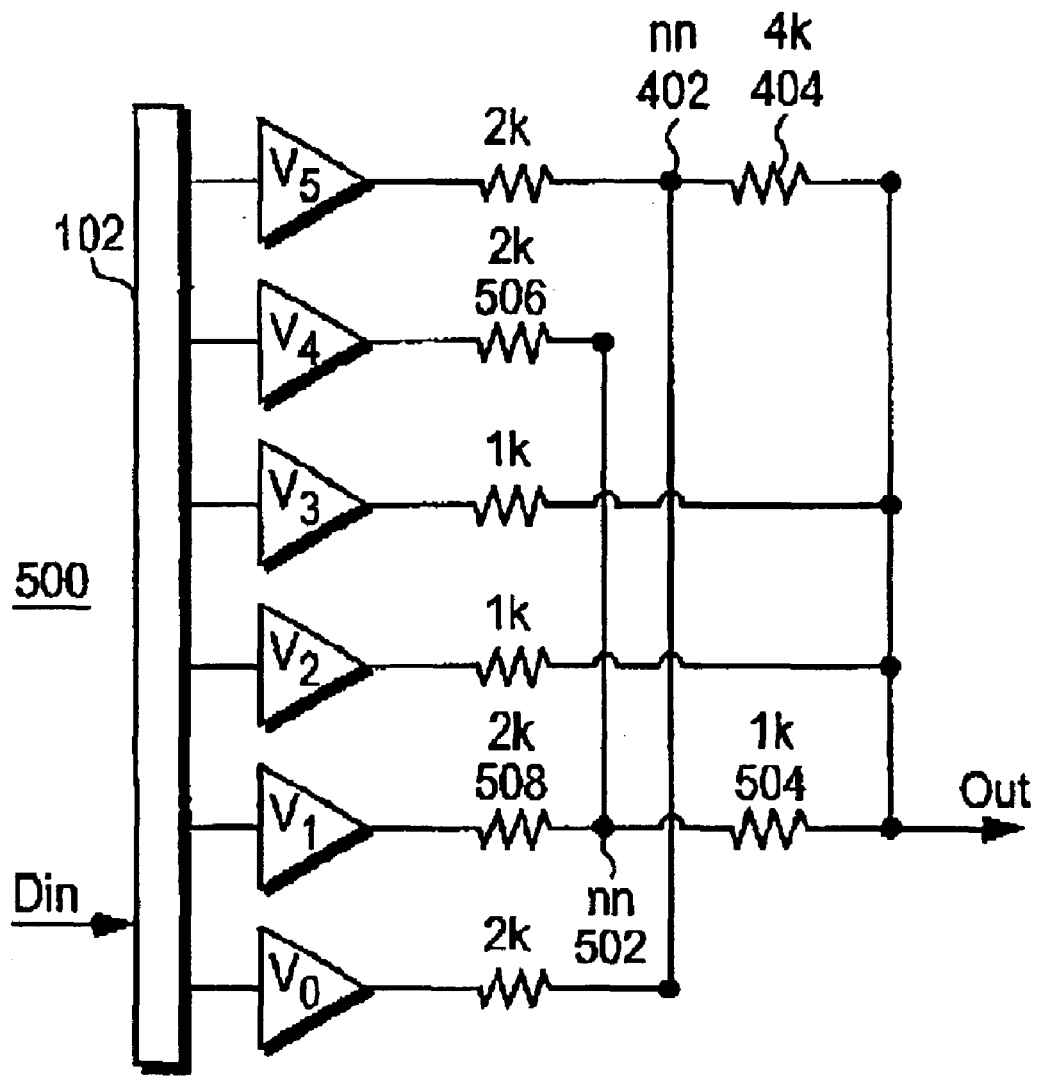
FIG. 5 is a diagrammatic view of a DAC according to the invention.

Referring to FIG. 5, a circuit 500 has a second common node, or new node, nn 502, serving to reduce the resistor values of $V_1$ and $V_4$ to 2 k. According to the invention, the configuration includes an intermediate resistor 504 of 1 k connected at one end to the conjoined resistors 506, 508, and at another end to the output. The resultant circuit has a reduced dynamic range compared to the conventional circuit 200 of FIG. 2, and has further reduced resistor values compared to the circuit 400 of FIG. 5. This configuration can be used to reduce similar circuits for the same purpose, reducing dynamic range and saving chip space of the resultant circuit.

Referring again to FIG. 1, one configuration of a resultant circuit embodying the invention is illustrated. As can be seen, the circuit 100 was reduced in dynamic range by use of intermediate resistors 108. As a result of the intermediate resistors, the resistors of resistor bank 106 are reduced in size, and thus the dynamic range of the circuit is reduced.

The invention has been described with reference to digital to analog converter having low power semi-analog finite impulse response circuit. It will be appreciated by those skilled in the art, however, that the invention has broader utility. Other embodiments may be implemented according to the invention without departing from the spirit and scope of the invention, the scope of which is to be construed in accordance with the following claims and their equivalents.

What is claimed is:

1. A semi-analog FIR digital to analog converter comprising:
   an input configured to receive a digital signal input;
   an output configured to transmit an impulse signal corresponding to the digital signal input;
   a primary finite impulse response circuit having a plurality of voltage sources corresponding to a bank of resistor values;
   a secondary finite impulse response circuit having a plurality of voltage sources corresponding to a plurality of intermediate resistors, wherein the secondary circuit is connected to the primary circuit via the plurality of intermediate resistors connected in parallel with certain resistors in the bank of resistors and configure to reduce the dynamic range of resistor values in the semi-analog FIR DAC and is connected to the output to produce an impulse output signal.

2. A digital to analog converter according to claim 1, wherein the secondary circuit is a Thevenin equivalent of a portion of the primary circuit.

3. A digital to analog converter according to claim 1, wherein the configured circuit is a Thevenin equivalent of a portion of the primary circuit.

4. A circuit according to claim 1, where in the secondary finite impulse response circuit shares the same plurality of voltage sources as the primary finite impulse response circuit, wherein the secondary circuit is connected to the primary finite impulse response circuit via a bank of intermediate resistors and is also connected to the output to produce an analog output signal corresponding to the digital input signal.

5. A converter according to claim 1, wherein the plurality of voltage sources correspond to the plurality of resistors, wherein the secondary circuit is connected to the primary circuit via an intermediate resistor circuit and wherein pairs of resistors having equal values are connected together in parallel with and then connected in parallel with other resistors with an intermediate resistor.

6. A digital to analog converter comprising:
   an input configured to receive a digital signal input signal;
   a primary finite impulse response circuit having a plurality of voltage sources corresponding to a plurality of resistors connected in parallel and in a parabolic manner;
   a secondary finite impulse response circuit having a plurality of voltage sources corresponding to a plurality of resistor values, wherein the secondary circuit is connected to the primary circuit via an intermediate resistor circuit, and wherein pairs of resistors having equal values are connected together in parallel with and then connected in parallel with other resistors with an intermediate resistor; and
   an output connected to the intermediate resistor and configured to transmit an impulse signal corresponding to the digital input signal.

7. A circuit according to claim 6, where in the secondary finite impulse response circuit shares the same plurality of voltage sources as the primary finite impulse response circuit, wherein the secondary circuit is connected to the primary finite impulse response circuit via a bank of intermediate resistors and is also connected to the output to produce an analog output signal corresponding to the digital input signal.

8. A semi-analog finite impulse response digital to analog converter ("semi-analog FIR DAC") comprising:
   an input configured to receive a digital signal input;
   an output configured to transmit an impulse signal corresponding to the digital signal input; and
   a finite impulse response circuit having a plurality of voltage sources corresponding to a plurality of resistors connected in a parallel with each other and a circuit having at least one pair of resistors connected together and to an intermediate resistor at a common node at one end of the intermediate resistor in a manner to reduce the dynamic range of resistor values in the semi-analog FIR DAC, where the resistor is connected at another end to the output to produce an impulse output signal.

9. A semi-analog finite impulse response digital to analog converter comprising:
   an input configured to receive a digital signal input signal;
   a bank of flip-flops clocked in synchronicity;
   a bank of voltage sources connected to the bank of flip-flops;
   a plurality of resistors having a range of resistance values and connected to the plurality of voltage sources in a Thevenin equivalent manner to reduce the dynamic range of resistance values required of a bank of resistors connected in parallel to produce an equivalent impulse signal output in response to a digital input signal.

10. A converter according to claim 9, wherein each flip flop from the bank of flip-flops corresponds with a voltage source from the bank of voltage sources, wherein each flip flop is configured to enable its corresponding voltage source alternately with other flip flops in the bank of flip flops.

11. A converter according to claim 9, wherein each flip flop from the bank of flip-flops corresponds with a voltage source from the bank of voltage sources, wherein each flip flop is configured to enable its corresponding voltage source alternately with other flip flops in the bank of flip flops to apply a voltage across resistors connected to the corresponding voltage source.

12. A converter according to claim 9, wherein the bank of voltage sources correspond to the plurality of resistors, wherein the secondary circuit is connected to the primary circuit via an intermediate resistor circuit, and wherein pairs of resistors having equal values are connected together in parallel with and then connected in parallel with other resistors with an intermediate resistor.

\* \* \* \* \*